United States Patent [19]

Ikeda

[11] Patent Number: 4,866,407
[45] Date of Patent: Sep. 12, 1989

[54] NOISE FILTER AND METHOD OF MAKING THE SAME

[76] Inventor: Takeshi Ikeda, 5-6-213 Sanno-2, Ohta-ku, Tokyo 143, Japan

[21] Appl. No.: 218,688

[22] Filed: Jul. 13, 1988

[51] Int. Cl.$^4$ .......................... H03H 7/01; H03H 7/09
[52] U.S. Cl. ...................................... 333/184; 333/12; 333/177; 333/185
[58] Field of Search ............... 333/186, 182, 184, 185, 333/167, 177, 23, 12

[56] References Cited

U.S. PATENT DOCUMENTS

| | | | |
|---|---|---|---|
| 2,260,296 | 10/1941 | Christopher et al. | 333/184 |
| 2,884,605 | 4/1959 | Dubilier | 333/23 X |

FOREIGN PATENT DOCUMENTS

| | | | |
|---|---|---|---|
| 0096910 | 5/1985 | Japan | 333/181 |
| 449742 | 7/1936 | United Kingdom | 333/181 |

*Primary Examiner*—Marvin L. Nussbaum
*Attorney, Agent, or Firm*—Allston L. Jones

[57] ABSTRACT

Four-terminal type noise filter having a first strip-like conductor with first inner and outer input/output leads each connected to the first conductor adjacent each end, a second strip-like conductor with second inner and outer input/output leads each connected to the second conductor adjacent each end, and dielectric sheets superimposed on the respective strip-like conductors. The sandwich of conductors and dielectric sheets are rolled into a flat tube such that the first and second inner leads defines a set of input and output terminals and said first and second outer leads defines another set of input and output terminals. The filter positively minimizes noise received by the filter without creation of ringing.

7 Claims, 12 Drawing Sheets

START OF ROLLING → END OF ROLLING

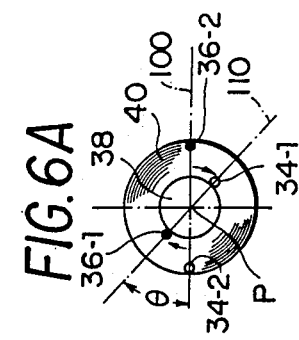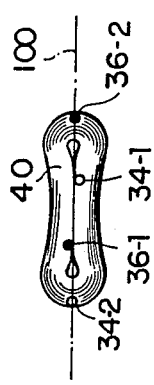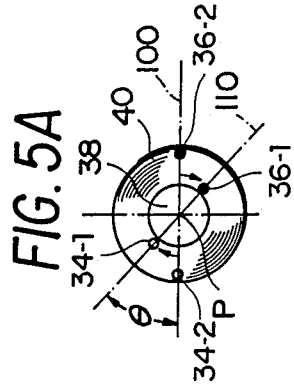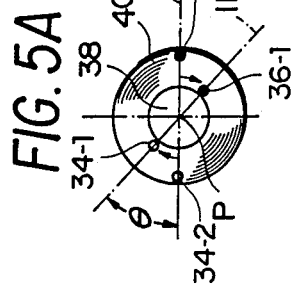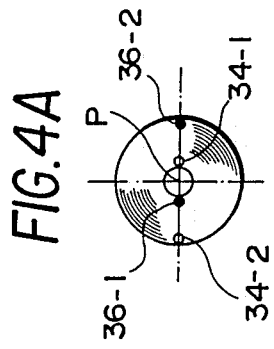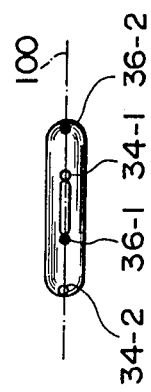

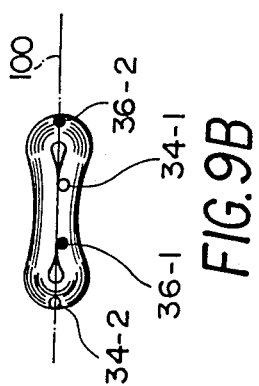
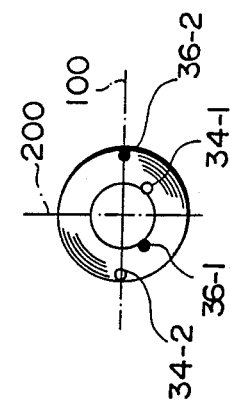
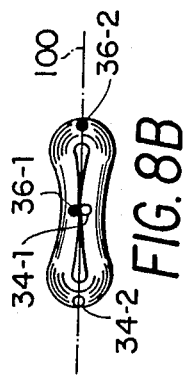
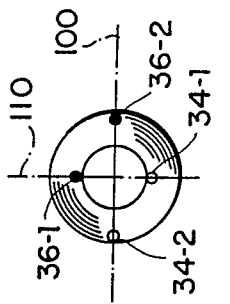
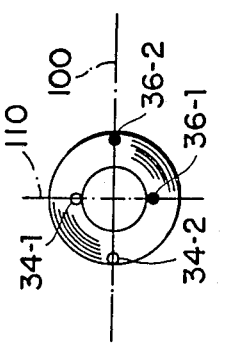

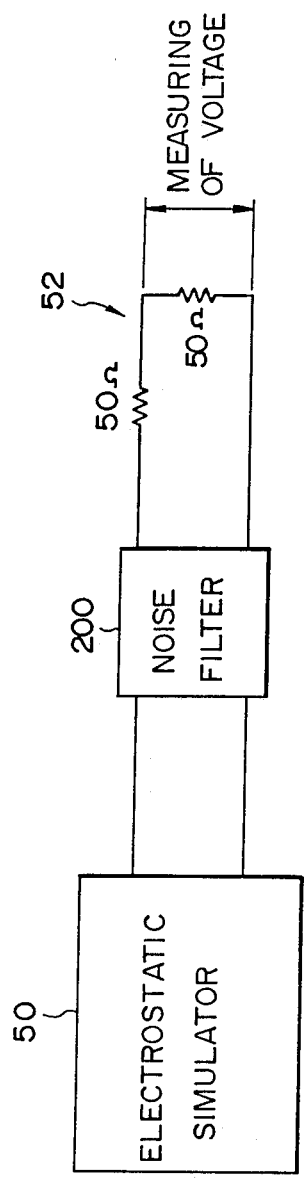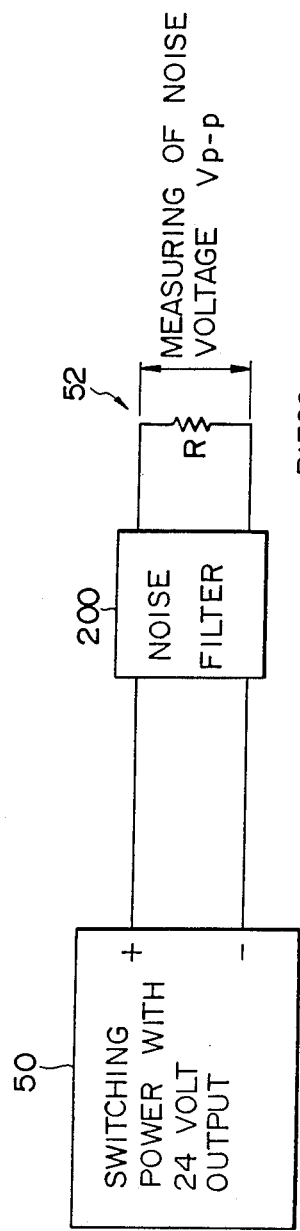

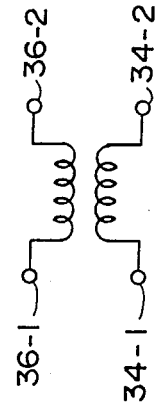
FIG. 15B PRIOR ART
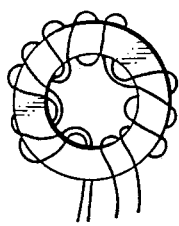
FIG. 15A PRIOR ART
FIG. 15C
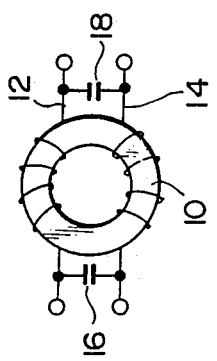
FIG. 14A PRIOR ART
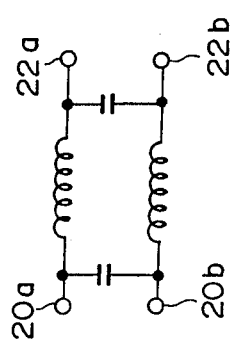
FIG. 14B PRIOR ART

| TOROIDAL COIL | L (μH) | C (nF) | R (mΩ) |
|---|---|---|---|
| TH 3820 B | 250 | — | 70 |
| TH 5130 B | 5.4 | 19 | 240 |
| | 9.8 | 28 | 310 |

SHORT-CIRCUITING

TOROIDAL COIL

TH3820B

TH5130B ( 0.1 μs /DIV   50mV/DIV )

| SPECIMEN \ ITEM | Vp-p (mv) | t (μs) |
|---|---|---|
| SHORT-CIRCUITING | 325 | 0.35 |
| TOROIDAL COIL | 70 | 0.35 |
| TH 3820B | 80 | 0.25 |
| TH 5130B | 75 | 0.23 |

SHORT-CIRCUITING

TOROIDAL COIL

TH 3820B

TH 5130B (IV/DIV   I μs/DIV)

| RIPPLE VOLTAGE SPECIMEN | Vp-p (V) |
|---|---|
| SHORT-CIRCUITING | 0.8 |
| TOROIDAL COIL | 2.0 |
| TH3820B | 0.4 |
| TH5130B | 0.3 |

NOISE FILTER AND METHOD OF MAKING THE SAME

BACKGROUND OF THE INVENTION

1. Field of the Invention

The present invention relates to a noise filter and a method of making the same, and particularly to a four-terminal type noise filter and a method of making the same.

2. Description of the Prior Art

With the development of electronic technology, electronic circuits have been used in a great variety of fields. It is desirable that such electronic circuits function in a stable and reliable state without that state being affected by an external occurrence such as noise on the power line.

However, direct or indirect effects on the electronic circuits cannot be avoided. This leads to a problem in that various electronic devices utilizing electronic circuits frequently malfunction.

Many electronic circuits use a switching regulator type power supply as a source of direct current. Due to transient currents on switching or from load variations resulting from the internal switching operations of the digital ICs, noises having various frequency components are frequently produced on the power line of the switching regulator. These noises are transmitted to the other circuit components in the same electronic device on the power line or by radiation to create a malfunction or a reduction of the signal to noise ratio. Furthermore, they may create a malfunction in any one of the other electronic devices used in the vicinity of the electronic device in which the noises are produced.

In order to minimize the noise, various types of noise filters have previously been used in the electronic circuits. Since the use of high-performance electronic instruments is increasing, noise regulations are increasingly being tightened. It is therefore desirable to have a small-sized and high-performance noise filter which can also minimize noise.

For such a purpose, a noise filter having an equivalent circuit as FIG. 14B of the accompanying drawings is currently used. In FIG. 14A a conventional four-terminal noise filter is shown. This filter comprises a magnetic core 10, a pair of windings 12 and 14 wound about the core 10, and capacitors 16 and 18 connected in parallel to each other between the corresponding ends of the windings 12 and 14. Since such an arrangement requires the core 10, the noise filter itself is of increased size and manufacturing cost in comparison to the other electronic components of the device have been reduced in size and weight.

From an inspection of FIG. 14B, it can further be seen that this prior art four-terminal type noise filter is a centralized constant type. Such an arrangement cannot eliminate various noise, and, more particularly, common mode noise as in switching surges and normal noise such as ripple noise. Additionally, if the values of the capacitors or coils are increased an undesirable ringing may occur.

SUMMARY OF THE INVENTION

It is therefore an object of the present invention to provide a four-terminal type noise filter which is reduced in size and which can positively minimize noise without creation of undesirable events, such as ringing and the like, and a method of making such a noise filter.

To this end, the present invention provides a common mode noise filter comprising a first strip-like conductor having second inner and outer input/output leads each connected to the first conductor adjacent each end, a second strip-like conductor having second inner and outer input/output leads each connected to the second conductor adjacent each end, and dielectric sheets superimposed on the respective conductors. The laminate sandwich of conductors and dielectric sheets are rolled into a cylinder such that the first and second inner leads defines a set of input and output terminals and the first and second outer leads defines another set of input and output terminals.

The present invention further provides a method of making a four-terminal type noise filter, the method being characterized by the steps of superimposing a plurality of strip-like conductors one on another and on dielectric sheets to form a laminate sandwich. First and second inner input/output leads are connected to each of the strip-like conductors adjacent the inner end thereof. The laminate sandwich is then rolled about a cylindrical shaft through a plurality of turns, and first and second outer input/output leads are connected to each of the strip-like conductors adjacent the outer end thereof such that the outer input/output leads are positioned substantially on a diametrical line about the central axis of the shaft. The cylindrically rolled laminated sandwich is removed from the shaft and the cylindrical rolled laminated sandwich is pressed in a direction perpendicular to a line connecting the outer leads to shape the laminated sandwich into an elliptic configuration in which the leads are arranged substantially on a straight line. In the finished configuration the first and second inner leads define a set of input and output terminals and the first and second outer leads define another set of input and output terminals.

BRIEF DESCRIPTION OF THE DRAWINGS

FIGS. 4A and 4B illustrate a modification of the noise filter shown in FIG. 1A.

FIGS. 5A and 5B through 9A and 9B illustrate a second preferred embodiment of a common mode noise filter constructed according to the present invention.

FIGS. 12 and 13 illustrate circuits used in tests wherein noises are eliminated by the use of the noise filter according to the present invention.

FIGS. 14A and 14B illustrate a centralized constant type common mode noise filter and its equivalent circuit as used in the prior art.

FIGS. 15A, 15B and 15C illustrate a conventional toroidal filter with FIG. 15A shown in the outline thereof, FIG. 15B is the core used in the filter and FIG. 15C the equivalent circuit of this filter.

FIGS. 18A, 18B, 18C and 18D are waveforms for the test performed using the circuit of FIG. 17.

DETAILED DESCRIPTION OF THE PREFERRED EMBODIMENTS

Figure 2:
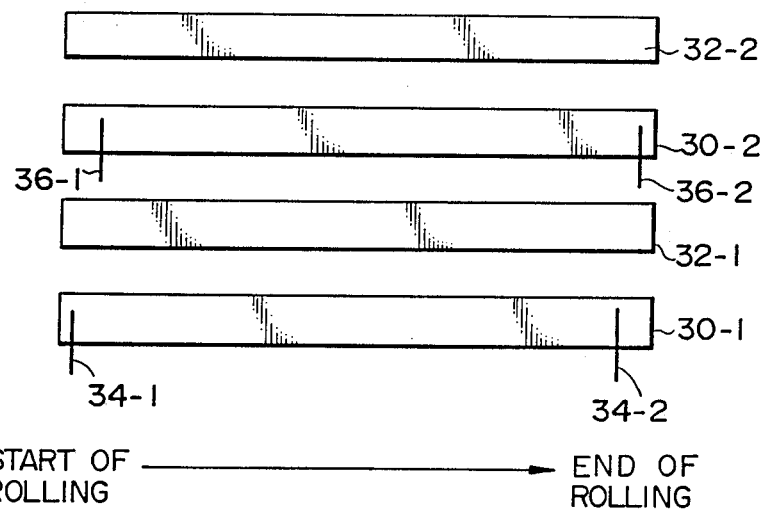
FIG. 2 illustrates the laminate construction technique used in all embodiments of the common mode noise filter of the present invention.

Referring first to FIG. 2 there is shown an exploded view of the elements from which each of the embodiments of the four-terminal noise filter of the present invention are constructed. The present invention filters include a first strip-like conductor 30-1 having first inner and outer input/output leads 34-1 and 34-2 which are connected to the conductor 30-1 adjacent the opposite ends thereof, and a second strip-like conductor 30-2 having second inner and outer input/output leads 36-1 and 36-2 which are connected to the conductor 30-2 adjacent the opposite ends thereof.

A dielectric sheet 32-1 is then superimposed on conductor 30-1 to form a sheet assembly. Similarly, a second dielectric sheet 32-2 is superimposed on the second conductor 30-2 to form another assembly. The two sheet assemblies are then superimposed one on the other to form a laminated sandwich which is, in turn, rolled onto a cylindrical shaft through a plurality of turns. The laminated rolled sandwich is then removed from the shaft and pressed to form an elliptical configuration. In such a rolled laminated sandwich the first and second inner leads 34-1 and 36-1 are used as a set of input and output terminals while the first and second outer leads 34-2 and 36-2 are used as another set of input and output terminals.

Figure 3:
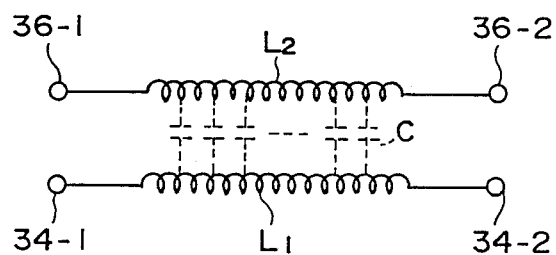
FIG. 3 is a diagram showing an equivalent circuit in the noise filter of the present invention.

Thus, the four-terminal type noise filter of the present invention provides a common mode noise filter of a distributed constant type with its equivalent circuit shown in FIG. 3.

More particularly, this noise filter provides an inductance $L_1$ depending on the number of turns in the rolled sandwich and the length of the strip-like conductor 30-1 between the leads 34-1 and 34-2. Additionally, the noise filter provides an inductance $L_2$ also depending on the number of turns in the rolled sandwich and the length of the strip-like conductor 30-2 between the leads 36-1 and 36-2.

Since the strip-like conductors 30-1 and 30-2 are engaged by each other through the dielectric sheets 32-1 and 32-2, there is a distributed capacitance with a value that is dependent on the length of the overlap between conductors 30-1 and 30-2. As seen from FIG. 3, the resulting four-terminal type noise filter of the present invention is a distributed constant type noise filter.

Since the four-terminal type noise filter of the present invention functions as a distributed constant type noise filter, as shown in FIG. 3, it provides a better attenuation over a relatively wide band in comparison with the conventional centralized constant type noise filters. The present invention filter further eliminates various noises without creating ringing in the circuit. Thus, the present invention filter can particularly eliminate common noise due to the effective function of the component L of the distributed constant shown in FIG. 3 and also remove normal noise due to the efficient function of the component C of the distributed constant shown in FIG. 3.

Figure 1A:
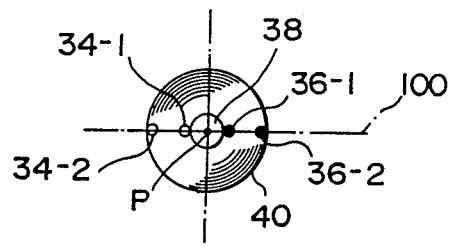
FIGS. 1A, 1B and 1C illustrate a preferred embodiment of a common mode noise filter constructed according to the present invention.
Figure 1B:
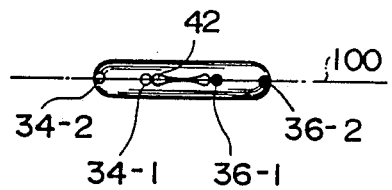
Figure 1C:
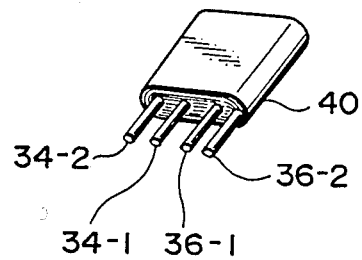

FIGS. 1A, 1B and 1C show a first preferred embodiment of a four-terminal type noise filter to which the principle of the present invention applies. To make the noise filter of this embodiment, as shown in FIG. 2, the two strip-like conductors 30-1 and 30-2 are superimposed one on the other with dielectric sheets 32-1 and 32-2 therebetween to form a laminated sandwich. Each of strip-like conductors 30-1 and 30-2 has its inner end (left end as viewed in FIG. 2) adjacent the other.

In this illustrated embodiment, inner leads 34-1 and 36-1 are to be positioned substantially on a diametrical line 100 about the rotational axis P of a cylindrical shaft 38 when the laminated sandwich is rolled about it.

As shown in FIG. 1A, the laminated sandwich is rolled about the cylindrical shaft 38 through a plurality of turns resulting in the first and second outer input/output leads 34-2 and 36-2 adjacent its outer edge positioned substantially on the diametrical line 100 about the central axis P of the cylindrical shaft 38 in the rolled laminated sandwich. Additionally, the outer leads 34-2 and 36-2 are respectively positioned outside the inner leads 34-1 and 36-1 on the diametrical line 100.

After the outer end of the roll 40 has been fastened to its body as by means of fusing or adhesion, the winding 40 is removed from the cylindrical shaft 38. The roll 40 is then pressed in a direction perpendicular to the diametrical line 100 connecting the outer leads 34-2 and 36-2 while heating the winding 40. Therefore, the core space 42 of the roll 40 left after cylindrical shaft 38 is removed is deformed to provide a flat roll as shown in FIG. 1B. In such a flat roll, all the leads 34-2, 34-1, 36-1 and 36-2 are arranged in line while at the same time the spacing between each adjacent lead is increased.

In such a situation, a relationship of $d=[(2\pi r)/2]=\pi r$ is established where r is the radius of the cylindrical shaft 38 and d is the thickness of the flat roll 40, the leads 34-1, 34-2, 36-1 and 36-2 can be spaced equidistantly one from another.

Although the arrangement of FIGS. 1A and 1B has the first inner and outer leads 34-1 and 34-2 located leftward about the rotational center P and the second inner and outer leads 36-1 and 36-2 positioned rightward about the same center P, the other arrangement may be provided in which the first outer and second inner leads 34-2 and 36-1 are arranged leftward about the rotational center P and the first inner and second outer leads 34-1 and 36-2 are disposed rightward about the same center P.

The resulting noise filter comprises the roll 40 in the shape of a substantially flat ellipsoid with four in-line leads 34-2, 34-1, 36-1 and 36-2 extending outwardly from the end of the roll 40, as best seen in FIG. 1C. The noise filter may also include a casing of metal foil wound about the outer periphery of roll 40 or may be coated with epoxy resins, if required.

Since the four-terminal type noise filter of the present invention consists of a substantially elliptic roll formed from strip-like conductors, it can be reduced in size and weight in comparison with the four-terminal type noise filter of the prior art as shown in FIG. 14A. The present design is very preferable for electronic devices that are becoming increasingly smaller and lighter in weight.

In the noise filter of the present invention, the leads 34-2, 34-1, 36-1 and 36-2 may be more easily inserted into printed circuit substrates since the leads are spaced away from each other with sufficient distance that is substantially uniform from filter to filter.

In accordance with the present invention, further, the spacing between the leads may be equalized to further promote the insertion of the leads into printed substrates if a suitable combination of the radius, r, of the cylindrical shaft 38, the number of turns in the roll 40, and so on is selected.

The present invention assures that the leads are arranged in line. The noise filter may be more easily mounted on substrates and yet resist any physical stress externally applied to the noise filter. In addition, the attenuation in the four-terminal type noise filter may be reduce in variability since the spacing between the leads can always be arranged while being maintained relatively constant. Consequently, the present invention can provide four-terminal type noise filters mass-produced with substantially uniform attenuation and with a substantial reduction in size.

Furthermore, the noise filter of the present invention functions as a distributed constant type noise filter as shown in FIG. 3, in which the L component effectively serves to eliminate common mode noise and the C component efficiently acts to remove the normal mode noise.

FIGS. 5A, 5B, 6A and 6B illustrate a second preferred embodiment of a four-terminal type noise filter constructed according to the present invention. In the second preferred embodiment, outer leads 34-2 and 36-2 are positioned on a diametrical line 100 passing through the rotational center P while inner leads 34-1 and 36-1 are located on another diametrical line 110 at the center P with an acute angle 0, as seen from FIG. 5A or 6A.

As shown in FIGS. 5B and 6B, a roll 40 formed as in the first embodiment is then pressed in a direction perpendicular to the diametrical line 100 to form a flat noise filter wherein the leads are arranged substantially in line although the linear arrangement thereof is slightly inferior to that of the first embodiment.

The noise filter of the second embodiment is particularly effective when the spacing between the leads is to be set equidistantly if the length of the core space 42 provided by collapsing the roll 40 is equal to or larger than the thickness of the flat roll 40.

In such a situation, by suitably calculating and determining the angle 0 between the diametrical lines 100 and 110 from the relationship between the thickness, d, of the flat roll 40 and the radius, r, of the cylindrical shaft 38, it is possible to equidistantly arrange the leads 34-2, 34-1, 36-1 and 36-2 in the same diametrical line, as shown in FIGS. 5B and 6B.

Where the outer leads 34-2 and 36-2 are positioned on the straight line 100 and the inner leads 34-1 and 36-1 are located on the straight line 110, it is required that both the straight lines 100 and 110 are arranged out of orthogonality.

If the straight line 100 extends perpendicular to the straight line 110, then when roll 40 is collapsed into a flat configuration the inner leads 34-1 and 36-2 are positioned immediately next to each other through a thin insulation sheet, as shown in FIGS. 7B or 8B. This does not provide a sufficient physical spacing therebetween which leads to a risk of short-circuiting between the inner leads upon wiring or soldering.

To provide a noise filter having leads equidistantly spaced one from another, first and second inner leads 34-1 and 36-1 may be positioned symmetrically about a straight line 200 that is perpendicular to the straight line 100, as shown in FIG. 9A. When the roll 40 is collapsed in a direction perpendicular to the straight line 100, the leads are thus equidistantly arranged in line as shown in FIGS. 5B and 6B.

Confirmation Test Of Noise Minimization

The four-terminal type noise filter of the present invention will now be described with respect to its noise eliminating ability.

(a) Test of Common Mode Noise

Figure 10:
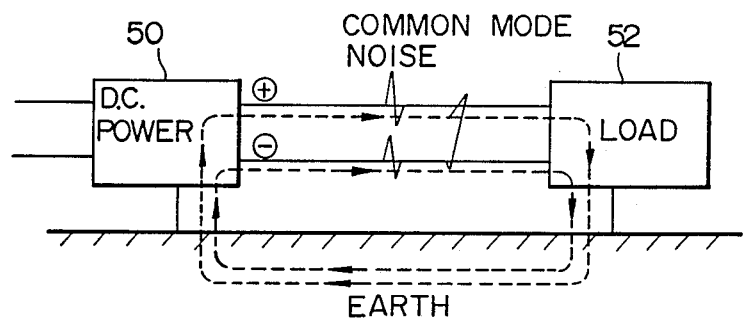
FIG. 10 illustrates common mode noises received by a load from a supply of direct current through a power line.

FIG. 10 illustrates an electronic device comprising a load 52, such as an electronic circuit, which receives a DC voltage from a DC source 50 through power lines. In such an arrangement, the load 52 receives noise.

Figure 11:
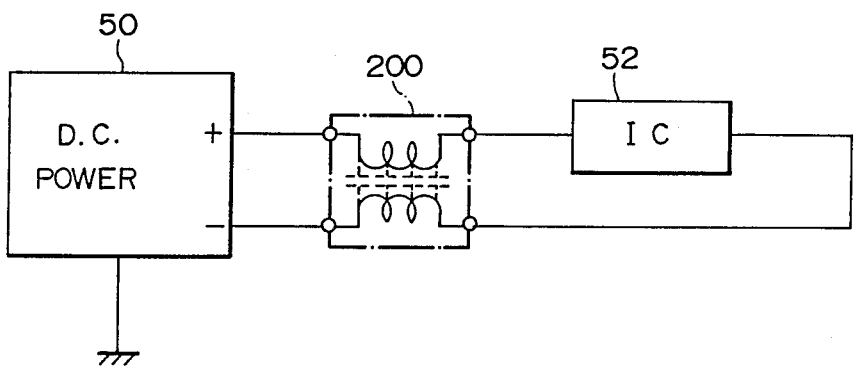
FIG. 11 illustrates the common mode noise filter of the present invention connected to the power line to reject the common mode noise as illustrated in FIG. 10.

Noise received by load 52 through the power lines is asymmetrical noise created on the earth side from the plus or minus power line, to which noise the common mode noise is the most prevalent. To minimize common mode noise, a noise filter 200 constructed according to the present invention is connected between the DC source 50 and load 52, as shown in FIG. 11.

The noise filter 200 used in this test was of the type shown in FIG. 1, wherein each of the strip-like conductors 30-1 and 30-2 was formed of an aluminum foil having an overall length of 90 cm, a width of 6 mm and thickness of 15 $\mu$m. Each of the dielectric sheets 32-1 and 32-2 was a Mylar tape having a width of 8 mm and a thickness of 9 $\mu$m. The cylindrical shaft 38 used to form a filter had a radius, r, of 1 mm.

First an electrostatic barrier test was performed using the circuit shown in FIG. 12. During this test, an electrostatic simulator having an output voltage equal to 1 KV was used as the DC source 50 while two resistors each having a resistance equal to 50 Ohms were connected in series with each other to form the load 52.

When filter 200 of the present invention was not used, a voltage equal to 112.0 V was created between the opposite ends of the series resistors. When the filter 200 was used, however, it was found that the voltage between the opposite ends of the series resistors was decreased to 20.8 V.

Next, a circuit shown in FIG. 13 was used to perform a test with respect to switching power supply output noise. In this test, load 52 was a 300 Ohm resistor.

When DC power source 50 was connected directly with the resistor 52 without use of the filter 200, noise having a level equal to 290 $mV_{p-p}$ was detected at the opposite ends of the resistor 52. When the filter 200 was connected between the DC power source 50 and the resistor 52, the noise was reduced to 80 $mV_{p-p}$.

The noise filter 200 of the present invention was substantially negligibly affected by ringing since it effectively reduced the common mode noise to attenuate any noise created by the ringing within a very brief period of time.

It was thus found that the noise filter of the present invention had a superior noise attenuation by which various possible sources of common mode noise, such as electrostatic noise and switching surge noise, could be positively minimized without creating ringing. This resulted from the fact that the noise filter of the present invention is a distributed constant type noise filter as shown in FIG. 3, particularly with the L component effectively serving to remove common mode noise created by various sources.

The advantages of the noise filter of the present invention were confirmed by comparison with a conventional noise filter. In the test, two types of filters, TH3820B and TH5130B, as noise filters relating to the present invention were used.

Noise filter TH3820B had strip-like conductors 30-1 and 30-2 each of which was made of an aluminum foil being 62 cm in overall length, 6 mm in width and 15 $\mu$m in thickness. Each of strip-like dielectrics 32-1 and 32-2 was made of Mylar tape being 8 mm in width and 9 $\mu$m in thickness. The cylindrical shaft 38 used to make the filter had a radius, r, equal to 1.0 mm.

Noise filter TH5130B comprised strip-like conductors 30-1 and 30-2 each of which was made of an aluminum foil being 90 cm in overall length, 6 mm in width and 9 $\mu$m in thickness, and strip-like dielectrics 32-1 and 32-2 each made of a polyester tape being 8 mm in width and 9 $\mu$m in thickness. The cylindrical shaft 38 used had a radius, r, equal to 1.0 mm.

The conventional noise filter was of a toroidal type as shown in FIG. 15A. The toroidal noise filter included a ring-like core having an internal diameter equal to 6 mm, an external diameter equal to 14 mm and a thickness equal to 3 mm, as shown in FIG. 15B. The outer periphery of the core had a coil formed by winding a wire having a diameter equal to 0.32 mm about the core through thirteen windings. FIG. 15C shows the equivalent circuit of the toroidal filter of FIG. 15A.

Figures 16, 17:
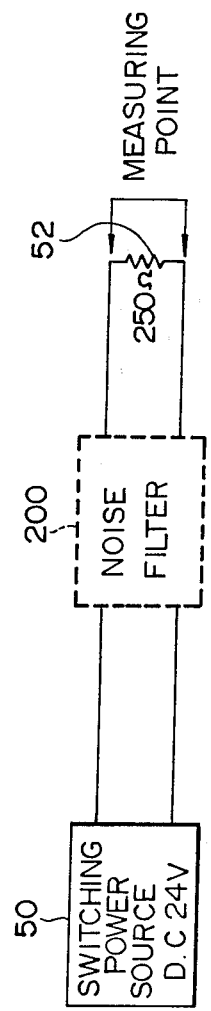
FIG. 16 is a table representing the electrical characteristics of the noise filter according to the present invention and conventional noise filters, all of which noise filters were tested.
FIG. 17 is a circuit diagram for a test to confirm reduction of common mode noise from the output power of a switching power source.

FIG. 16 illustrates the electrical characteristics of the two noise filters, TH3820B and TH5130B, of the present invention, and the conventional toroidal filter shown in FIG. 15A. In FIG. 16, all values of L were measured at the terminals 36-1 and 34-1. The measurement frequency, f, was selected to be 1 kHz.

The filters so formed were used to measure switching power output noise, which was a certain type of common mode noise, using a circuit shown in FIG. 17. In this test, the load 52 was a resistor of 250 Ohms and the DC power source 50 was 24 VDC.

FIGS. 18A–18D illustrate the waveforms measured in the test, in which the axes of abscissa and ordinate represent time and measured voltage, respectively, for no filter and each of the three filters.

Figure 18A:
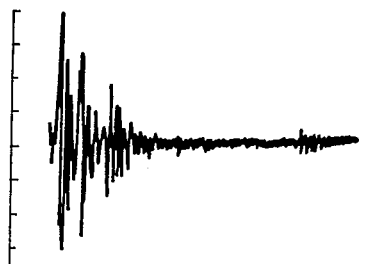
Figure 18B:
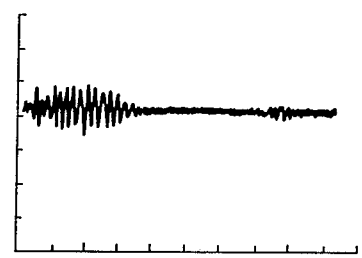
Figure 18C:
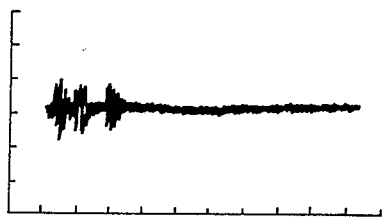
Figure 18C:

FIG. 18A shows data measured when the measuring points are short-circuited (no filter); FIG. 18B shows data measured when the toroidal noise filter is used; FIG. 18C shows data measured when the noise filter TH3820B of the present invention was used; and FIG. 18D shows data measured when the noise filter TH5130B of the present invention was used.

Figure 19:
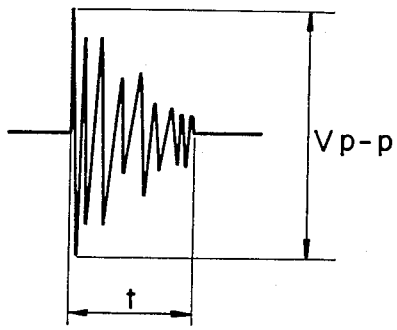
FIG. 19 illustrates data resulting from the test by the use of the circuit shown in FIG. 17.

FIG. 19 shows numerical data measured in the above test wherein $V_{p-p}$ represents the peak-to-peak value of the common mode noise voltage and t indicates time required for that noise to converge to zero volts.

As will be understood from the above measurements, use of the noise filter of the present invention results in a very reduced time period to converge the common mode noise to zero volts. Due to this, the noise filter of the present invention is only negligibly affected by ringing.

(b) Test of Normal Mode Noise

Figure 20:
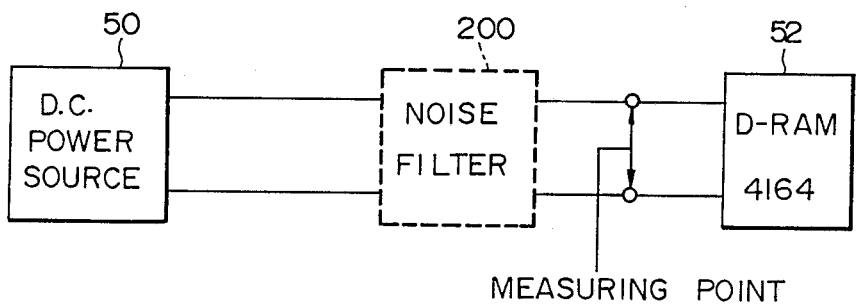
FIG. 20 is a circuit diagram for a test to confirm reduction of ripple on a DC power line for D-RAM (normal mode noise).
Figure 21A:
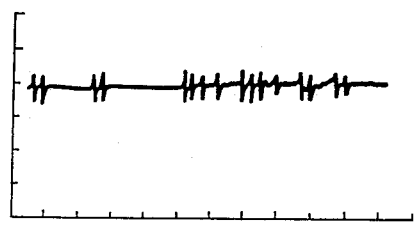
FIGS. 21A, 21B, 21C and 21D are waveforms for the test performed using the circuit of FIG. 20.
Figure 21B:
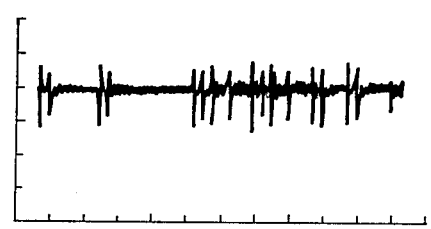
Figure 21C:
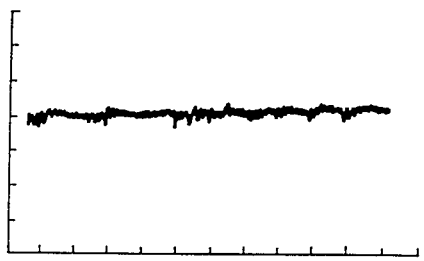
Figure 21D:
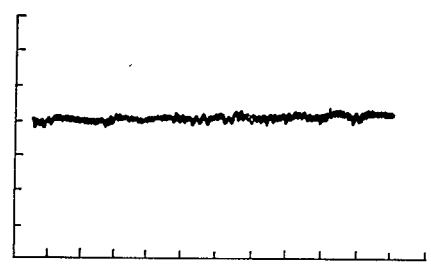

Next, a circuit shown in FIG. 20 was used to test the reduction of normal mode noise. In this test, the reduction of ripple noise components were particularly measured on the DC line for a D-RAM.

FIG. 21 illustrates measurements resulting from such a test: FIG. 21A shows data measured when the measuring points were short-circuited (no filter); FIG. 21B shows data measure when the toroidal noise filter of the prior art was used; FIG. 21C shows data measured when noise filter TH3820B of the present invention was used; and FIG. 21D shows data measured when noise filter TH5130B of the present invention was used.

Figure 22:
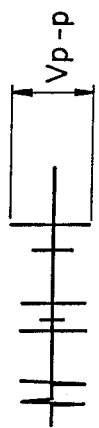
FIG. 22 illustrates data resulting from the test by the use of the circuit shown in FIG. 20.

FIG. 22 provides numerical values for the various filters and no filter for the test of FIG. 20.

As can be seen from the above measurements, the toroidal filter provided increased ripple voltages in comparison with the absence of a filter. On the other hand, the noise filters of the present invention highly reduce the ripple voltages.

In such a manner, it has been found that the noise filter of the present invention provides superior noise attenuation by which various possible sources of normal mode noise can positively be eliminated. This results from the fact that the noise filter of the present invention functions as a distributed constant type noise filter as shown in FIG. 3, particularly with the C component effectively acting to eliminate the normal mode noise.

It is to be understood that the present invention is not limited to the illustrated embodiments, but can be modified and changed into various configurations without departing from the spirit and range of the present invention as claimed in the following claims. For example, the noise filter of the present invention may include a magnetic core within the central space of the roll 40 or be formed of magnetic conductors when it is desired to increase the inductance in the coils $L_1$ and $L_2$.

Although the illustrated embodiments have been described as having two strip-like conductors 30-1 and 30-2, and two dielectric sheets 32-1 and 32-2, the present invention can be extended to include an arrangement with three strip-like conductors and three dielectric sheets used to form a roll with two of these strip-like conductors having input/output leads.

Although the illustrated embodiments have been described each having an elliptic collapsed configuration, the present invention may be similarly applied to a noise filter having a circular cross-section. In the latter case, the mounting of the leads should be predetermined in consideration of the diameter of the cylindrical shaft 38 and the overall length of the strip-like conductors such that the leads will be arranged in line on the finished filter. As a result, a four-terminal type noise filter having a circular cross-section can be provided with its leads arranged substantially on a diametrical line in the circular body. Similarly, this noise filter may positively eliminate the common mode normal mode noises.

Although the illustrated embodiments have been described for use with a DC line, the noise filter of the present invention may be similarly applied to an AC line.

As described above, the present invention can provide a four-terminal type noise filter having superior attenuation and of reduced size and weight, the noise filter being capable of positively minimizing various noises created in the electronic circuits without creation of ringing.

Since the input/output leads can be disposed on a straight line passing through the center of the cylindrical shaft with constant spacing in accordance with the principle of the present invention, the noise filter can have a substantially uniform and yet superior attenuation and be manufactured efficiently in a mass-production mode. This means that problems in manufacturing such distributed constant type noise filters, such as irregular characteristics from one to another filter or reduced yield, can be overcome according to the present invention.

What is claimed is:

1. A four-terminal distributed constant type noise filter comprising:
   a lamination including:
      a first foil layer of an electrically conductive material of a selected length;
      a second foil layer of an electrically conductive material of substantially the same selected length as the first foil layer;
      a first insulative layer that is substantially the same selected length as said first foil layer and intermediate the first and second foil layers; and
      a second insulative layer that is substantially the same selected length as said first foil layer and on the other side of one of the first and second foil layers from the first insulative layer;
      said lamination is wound in substantially an elliptical shape having a long and a short axis with each of the ends of the four layers substantially in alignment; and
   a first terminal connected to the first foil layer near the end that is in the inner most portion of the wound lamination and disposed substantially along the long axis of the elliptical shape of the wound lamination;
   a second terminal connected to the first foil layer near the end that is in the outer most portion of the wound lamination, substantially along the long axis of the elliptical shape of the wound lamination, and extending from the same surface of the wound lamination as the first terminal;
   a third terminal connected to the second foil layer near the end that is in the outer most portion of the wound lamination, substantially along the long axis of the elliptical shape of the wound lamination, and extending from the same surface of the wound lamination as the first terminal; and
   a fourth terminal connected to the second foil layer near the end that is in the inner most portion of the wound lamination, disposed substantially along the long axis of the elliptical shape of the wound lamination, spaced apart from the first terminal, and extending from the same surface of the wound lamination as the first terminal.

2. A noise filter as in claim 1 wherein said lamination has a protective coating to seal the filter.

3. A method of making a four-terminal type noise filter, comprising the steps of;
   alternately superimposing a pair of strip-like conductors and a pair of dielectric sheets one on top of another to form a laminate sandwich;
   connecting a lead wire to each of the adjacent one ends of each of said strip-like conductors;
   rolling said laminate sandwich about a cylindrical shaft through a plurality of turns such that said lead wires on the adjacent one ends of each of said strip-like conductors are spaced-apart from each other around the circumference of said cylindrical shaft;
   connecting a lead wire to each of the adjacent other ends of said strip-like conductors such that the leads on the other ends of said strip-like conductors will be spaced-apart from and positioned substantially on opposite sides of said cylindrical shaft when said laminate sandwich is rolled about said cylindrical shaft;
   removing said rolled laminate sandwich from said cylindrical shaft; and
   pressing said rolled laminate sandwich in a direction perpendicular to a straight line between said lead wires connected to the other ends of said strip-like conductors to form an elliptic configuration wherein all of said lead wires are arranged substantially in line, said lead wires connected to said one and other ends of the one of the strip-like conductors each defining an input terminal pair and said lead wires connected to said one and other ends of the other of the strip-like conductors each defining an output terminal pair.

4. A method as defined in claim 3 wherein said lead wires connected to the one ends of the respective strip-like conductors are placed such that said lead wires will be positioned substantially on on opposite sides of said cylindrical shaft when said laminate sandwich is rolled about the cylindrical shaft.

5. A method as defined in claim 3 wherein said lead wires connected to the one ends of the respective strip-like conductors are placed such that said lead wires connected to the one ends of the respective strip-like conductors will be arranged symmetrically about a line perpendicular to the line between said lead wires connected to the other ends of the respective strip-like conductors when said laminate sandwich is rolled about said cylindrical shaft.

6. A method as defined in claim 3 wherein all of said lead wires are arranged to be equidistantly spaced and substantially in line with each other following the step of pressing said rolled laminate sandwich.

7. A method as defined in claim 3 further including the step of coating the rolled and pressed filter to seal the filter.

* * * * *